(12) United States Patent
Gomes et al.

(10) Patent No.: US 12,058,849 B2
(45) Date of Patent: Aug. 6, 2024

(54) THREE-DIMENSIONAL NANORIBBON-BASED DYNAMIC RANDOM-ACCESS MEMORY

(71) Applicant: Intel Corporation, Santa Clara, CA (US)

(72) Inventors: Wilfred Gomes, Portland, OR (US); Kinyip Phoa, Beaverton, OR (US); Mauro J. Kobrinsky, Portland, OR (US); Tahir Ghani, Portland, OR (US); Uygar E. Avci, Portland, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 17/522,225

(22) Filed: Nov. 9, 2021

(65) Prior Publication Data
US 2022/0068931 A1 Mar. 3, 2022

Related U.S. Application Data

(63) Continuation of application No. 16/691,163, filed on Nov. 21, 2019, now Pat. No. 11,257,822.

(51) Int. Cl.
*H10B 12/00* (2023.01)
*H01L 29/06* (2006.01)
(Continued)

(52) U.S. Cl.
CPC ........... *H10B 12/312* (2023.02); *H01L 28/60* (2013.01); *H01L 29/0673* (2013.01);
(Continued)

(58) Field of Classification Search
CPC ........ H10B 12/02; H10B 12/03; H10B 12/05; H10B 12/30; H10B 12/312; H10B 53/10;
(Continued)

(56) References Cited

U.S. PATENT DOCUMENTS 6,163,482 A 12/2000 Chi
7,092,288 B2 8/2006 Lojek
(Continued)

FOREIGN PATENT DOCUMENTS

CN 109616474 A * 4/2019 ......... H01L 27/0688
EP 3534401 A2 9/2019
(Continued)

OTHER PUBLICATIONS

U.S. Appl. No. 16/669,599, filed Oct. 31, 2019, Wilfred Gomes.
(Continued)

*Primary Examiner* — Matthew E Warren
(74) *Attorney, Agent, or Firm* — Akona IP PC

(57) ABSTRACT

Described herein are IC devices that include semiconductor nanoribbons stacked over one another to realize high-density three-dimensional (3D) dynamic random-access memory (DRAM). An example device includes a first semiconductor nanoribbon, a second semiconductor nanoribbon, a first source or drain (S/D) region and a second S/D region in each of the first and second nanoribbons, a first gate stack at least partially surrounding a portion of the first nanoribbon between the first and second S/D regions in the first nanoribbon, and a second gate stack, not electrically coupled to the first gate stack, at least partially surrounding a portion of the second nanoribbon between the first and second S/D regions in the second nanoribbon. The device further includes a bitline coupled to the first S/D regions of both the first and second nanoribbons.

20 Claims, 9 Drawing Sheets

(51) Int. Cl.
*H01L 29/423* (2006.01)
*H01L 29/49* (2006.01)
*H01L 29/51* (2006.01)
*H01L 29/78* (2006.01)
*H01L 29/786* (2006.01)
*H01L 49/02* (2006.01)

(52) U.S. Cl.
CPC .... *H01L 29/42392* (2013.01); *H01L 29/4908* (2013.01); *H01L 29/516* (2013.01); *H01L 29/78391* (2014.09); *H01L 29/78618* (2013.01); *H01L 29/78696* (2013.01)

(58) Field of Classification Search
CPC ......... H10B 53/20; H10B 53/30; H01L 28/60; H01L 29/0669; H01L 29/0673; H01L 29/42392; H01L 29/4908; H01L 29/516; H01L 29/78618; H01L 29/78696
See application file for complete search history.

(56) References Cited

U.S. PATENT DOCUMENTS

| | | | |
|---|---|---|---|
| 7,701,751 B2 | 4/2010 | Kang et al. | |
| 7,804,702 B2 | 9/2010 | Madan | |
| 8,178,862 B2 | 5/2012 | Colinge | |
| 8,687,399 B2* | 4/2014 | Sekar | H10B 12/05 365/174 |
| 11,018,264 B1 | 5/2021 | Gomes et al. | |
| 11,056,492 B1 | 7/2021 | Gomes et al. | |
| 11,087,832 B1 | 8/2021 | Gomes et al. | |
| 11,139,300 B2 | 10/2021 | Gomes et al. | |
| 11,171,145 B2 | 11/2021 | Chang et al. | |
| 11,502,084 B2* | 11/2022 | Shin | H10B 43/20 |
| 2002/0036313 A1 | 3/2002 | Yang et al. | |
| 2006/0084204 A1 | 4/2006 | Yin et al. | |
| 2009/0010055 A1 | 1/2009 | Kang et al. | |
| 2009/0303801 A1 | 12/2009 | Kim | |
| 2010/0295102 A1 | 11/2010 | Sankin et al. | |
| 2012/0273747 A1 | 11/2012 | Saitoh et al. | |
| 2014/0054538 A1* | 2/2014 | Park | H10B 63/845 257/5 |
| 2015/0035568 A1 | 2/2015 | Peng et al. | |
| 2015/0162336 A1 | 6/2015 | Kim et al. | |
| 2015/0340372 A1 | 11/2015 | Pandey et al. | |
| 2016/0197069 A1 | 7/2016 | Morrow et al. | |
| 2017/0103988 A1 | 4/2017 | Nishida et al. | |
| 2017/0256552 A1 | 9/2017 | Schröder et al. | |
| 2017/0287905 A1 | 10/2017 | Morrow et al. | |
| 2018/0162336 A1 | 6/2018 | Ngomssu et al. | |
| 2018/0323199 A1 | 11/2018 | Roberts et al. | |
| 2019/0006376 A1* | 1/2019 | Ramaswamy | H10B 53/20 |
| 2019/0074277 A1* | 3/2019 | Ramaswamy | H10B 12/30 |
| 2019/0103406 A1 | 4/2019 | Tang et al. | |
| 2019/0164985 A1* | 5/2019 | Lee | G11C 7/18 |
| 2019/0189357 A1 | 6/2019 | Chavan et al. | |
| 2019/0287908 A1 | 9/2019 | Dogiamis et al. | |
| 2019/0305135 A1 | 10/2019 | Radosavljevic et al. | |
| 2020/0127142 A1 | 4/2020 | Dewey et al. | |
| 2020/0194443 A1 | 6/2020 | Lin et al. | |
| 2020/0227416 A1* | 7/2020 | Lilak | H10B 12/482 |
| 2020/0259018 A1 | 8/2020 | Rami et al. | |
| 2020/0273867 A1 | 8/2020 | Manipatruni et al. | |
| 2020/0279601 A1* | 9/2020 | Kim | G11C 7/18 |
| 2020/0286984 A1 | 9/2020 | Chang et al. | |
| 2021/0028231 A1 | 1/2021 | Andrieu et al. | |
| 2021/0036144 A1 | 2/2021 | Liaw | |
| 2021/0125990 A1 | 4/2021 | Gomes et al. | |
| 2021/0134802 A1 | 5/2021 | Gomes et al. | |
| 2021/0151438 A1 | 5/2021 | Gomes et al. | |
| 2021/0159229 A1 | 5/2021 | Gomes et al. | |
| 2021/0184052 A1 | 6/2021 | Gomes et al. | |
| 2021/0193666 A1 | 6/2021 | Gomes et al. | |
| 2021/0210601 A1 | 7/2021 | Pidin | |
| 2021/0272624 A1 | 9/2021 | Gomes et al. | |
| 2021/0305250 A1 | 9/2021 | Yang et al. | |
| 2021/0335791 A1 | 10/2021 | Gomes et al. | |
| 2021/0375926 A1 | 12/2021 | Mehandru et al. | |
| 2021/0398991 A1 | 12/2021 | Manfrini et al. | |
| 2022/0045065 A1 | 2/2022 | Gomes et al. | |
| 2022/0068931 A1 | 3/2022 | Gomes et al. | |
| 2023/0253033 A1 | 8/2023 | Ramaraju | |

FOREIGN PATENT DOCUMENTS

| | | |
|---|---|---|
| TW | 201830585 A | 8/2018 |
| TW | 1734112 | 5/2019 |
| TW | 202119594 | 5/2021 |
| WO | 2018125024 A1 | 7/2018 |
| WO | 2018208719 A1 | 11/2018 |
| WO | 2021112247 A1 | 6/2021 |

OTHER PUBLICATIONS

U.S. Appl. No. 16/884,524, filed May, 27, 2020, Rishabh Mehandru.
Anil, D.G., et al., "Performance Evaluation of Ternary Computation in SRAM Design Using Graphene Nanoribbon Field Effect Transistors," IEEE 8th Annual Computing and Communication Workshop and Conference (CCWC), Las Vegas, NV, pp. 382-388 (2018).
Extended European Search Report from European Application No. 20181563.63 dated Apr. 13, 2021, 11 pages.
Extended European Search Report from European Application No. 20191821.6 dated Feb. 2, 2021, 9 pages.
Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.
Joshi, S., et al., "Graphene Nanoribbon Field Effect Transistor Based Ultra-Low Energy SRAM Design," IEEE International Symposium on Nanoelectronic and Information Systems (INIS), Gwalior, pp. 76-79 (2016).
Khasanvis, S., et al., "Low-Power Heterogeneous Graphene Nanoribbon-CMOS Multistate Volatile Memory Circuit," 17 pages.
Non Final Office Action in U.S. Appl. No. 16/669,599 dated Jul. 13, 2021 10 pgs.
Non Final Office Action of U.S. Appl. No. 16/669,599 dated Jan. 11, 2021, 9 pages.
Non Final Office Action of U.S. Appl. No. 16/669,599 dated Jul. 13, 2021, 10 pages.
Non Final Office Action of U.S. Appl. No. 16/691,163 dated Jul. 23, 2021, 6 pages.
Non Final Office Action of U.S. Appl. No. 16/806,283 dated Jan. 7, 2021, 7 pages.
Notice of Allowance in U.S. Appl. No. 16/691,163 dated Oct. 20, 2021, 6 pages.
Notice of Allowance in U.S. Appl. No. 16/724,691 dated Apr. 10, 2021, 2 pages.
Notice of Allowance in U.S. Appl. No. 16/724,691 dated Jan. 13, 2021. 9 pages.
Notice of Allowance in U.S. Appl. No. 16/806,283 dated Apr. 16, 2021, 5 pages.
Partial European Search Report from European Application No. 20181563.6 dated Jan. 21, 2021, 13 pages.
Rabieefar, et al., "Utilizing Graphene Nano-Ribbon Transistor in Data Converters: A Comparative Study," ECS Journal of Solid State Science and Technology, 8; M30-M37 (2019).
Supplemental Notice of Allowance issued in U.S. Appl. No. 16/724,691 on Feb. 1, 2021; 7 pages.
Trombini, H., et al., "Unraveling structural and compositional information in 3D FinFET electronic devices," Nature.com/Scientific Reports; 7 pages (Aug. 12, 2019).
Xu, C., et al., "Modeling, Analysis, and Design of Graphene Nano-Ribbon Interconnects," IEEE Transaction on Electron Devices; vol. 56, No. 8; pp. 1567-1578 (Aug. 2009).
Chang et al., "A Thermodynamic Perspective of Negative-Capacitance Field-Effect Transistors" IEEE Journal on Exploratory Solid-State Computational Devices and Circuits; vol. 3; 9 pages (2017).

(56) References Cited

OTHER PUBLICATIONS

Chang et al., "Inversion Charge Boost and Transient Steep-Slope Induced by Free-Charge-Polarization Mismatch in a Ferroelectric-Metal-Oxide-Semiconductor Capacitor," IEEE Journal on Exploratory Solid-State Computational Devices and Circuits; vol. 4, No. 2; 6 pages (Dec. 2018).

Chang et al., "Physical Origin of Transient Negative Capacitance in a Ferroelectric Capacitor," Physical Review Applied 9; 8 pages (2018).

\* cited by examiner

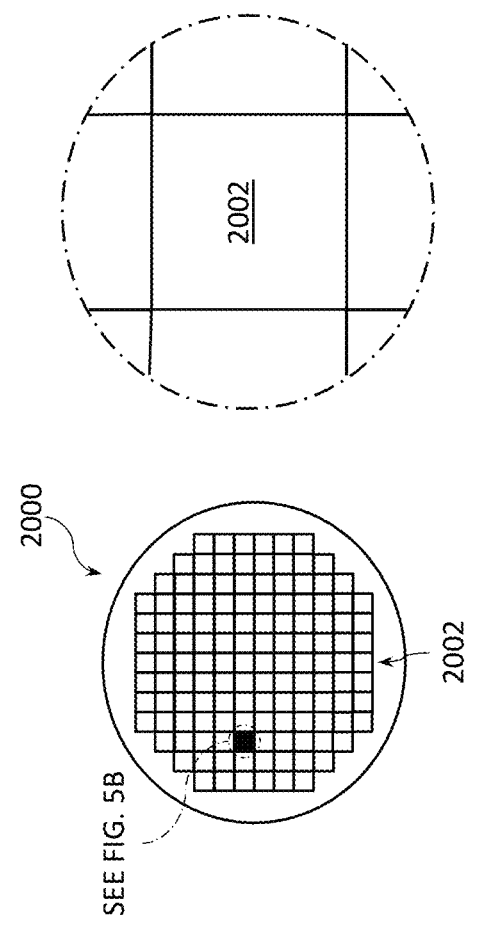

THREE-DIMENSIONAL NANORIBBON-BASED DYNAMIC RANDOM-ACCESS MEMORY

CROSS-REFERENCE TO RELATED APPLICATIONS

This application is a continuation and claims the benefit of priority under 35 U.S.C. § 120 of U.S. application Ser. No. 16/691,163, filed Nov. 21, 2019, and entitled THREE-DIMENSIONAL NANORIBBON-BASED DYNAMIC RANDOM-ACCESS MEMORY, the disclosure of which is incorporated by reference herein in its entirety.

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A and 5B are top views of, respectively, a wafer and dies that may include one or more 3D nanoribbon-based DRAM devices in accordance with any of the embodiments disclosed herein.

DETAILED DESCRIPTION

Overview

Figure 1:
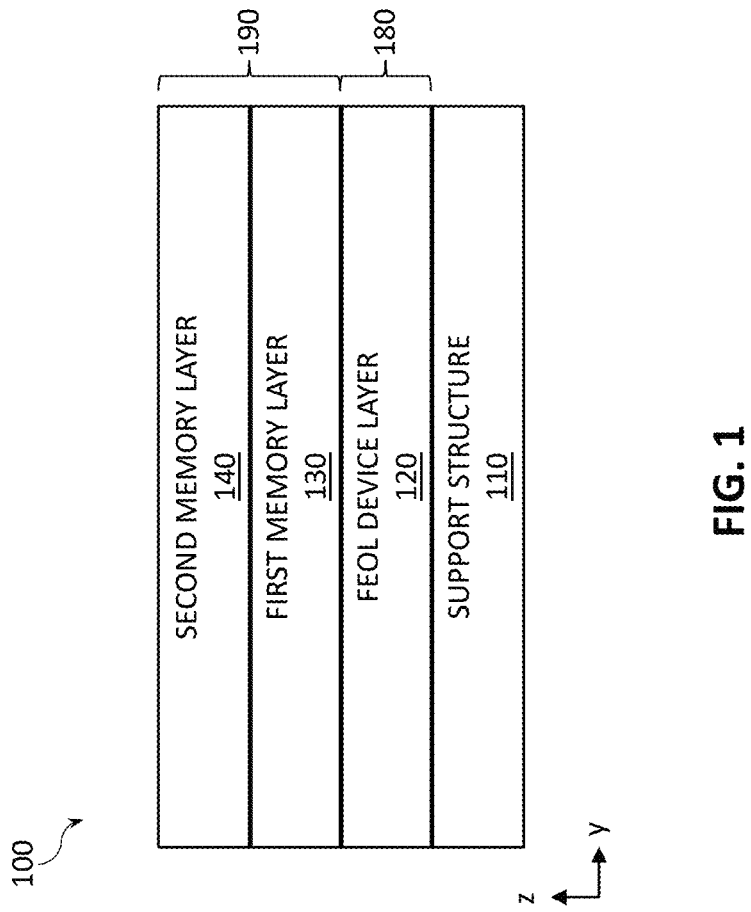
FIG. 1 provides a schematic illustration of an integrated circuit (IC) device with multiple layers of memory and logic that may include three-dimensional (3D) nanoribbon-based dynamic random-access memory (DRAM), according to some embodiments of the present disclosure.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to DRAM and in particular, embedded DRAM (eDRAM), because this type of memory has been introduced in the past to address the limitation in density and standby power of some other types of memory devices. However, embodiments of the present disclosure may be equally applicable to memory cells implemented other technologies. Thus, in general, memory cells described herein may be implemented as eDRAM cells, spin-transfer torque random access memory (STTRAM) cells, resistive random-access memory (RRAM) cells, or any other non-volatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) region/terminal of the access transistor (e.g., to the source region of the access transistor), while the other S/D region of the access transistor may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology, e.g., static random-access memory (SRAM).

Various 1T-1C memory cells have, conventionally, been implemented with access transistors being FEOL, logic-process based, transistors implemented in an upper-most layer of a semiconductor substrate. Inventors of the present disclosure realized that using conventional FEOL transistors creates several challenges for increasing memory density.

One challenge resides in that, given a usable surface area of a substrate, there are only so many FEOL transistors that can be formed in that area, placing a significant limitation on the density of memory cells incorporating such transistors. In conventional solutions, attempts to increase memory density have included decreasing the critical dimensions of the 1T-1C memory cells, which requires ever-increasing process complexity and cost, resulting in diminishing returns and expected slow pace of memory scaling for future nodes.

Embodiments of the present disclosure may improve on at least some of the challenges and issues described above by increasing the number of active memory layers, to generate a vertically-stacked DRAM design using fewer masks and at a lower cost. In particular, embodiments of the present disclosure are based on using semiconductor nanoribbons stacked above one another to realize high-density 3D DRAM. In the context of the present disclosure, the term "above" may refer to being further away from the support structure or the FEOL of an IC device, while the term "below" refers to being closer towards the support structure or the FEOL of the IC device. Furthermore, as used herein, the term "nanoribbon" refers to an elongated semiconductor structure having a long axis parallel to a support structure (e.g., a substrate, a chip, or a wafer) over which a memory device is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section. In the present disclosure, the term "nanoribbon" is used to describe both such nanoribbons and such nanowires, as well as elongated semiconductor structures with a longitudinal axis parallel to the support structures and with having transverse cross-sections of any geometry (e.g., oval, or a polygon with rounded corners).

An example memory device according to some embodiments of the present disclosure may include a first nanoribbon of a first semiconductor material, a second nanoribbon of a second semiconductor material, a first source or drain (S/D) region and a second S/D region in each of the first nanoribbon and the second nanoribbon, a first gate stack at least partially surrounding a portion of the first nanoribbon between the first S/D region and the second S/D region in the first nanoribbon, and a second gate stack, not electrically coupled to the first gate stack (i.e., controlled independently of the first gate stack), at least partially surrounding a portion of the second nanoribbon between the first S/D region and the second S/D region in the second nanoribbon. The memory device may further include a bitline coupled to, both, the first S/D region of the first nanoribbon and the first S/D region of the second nanoribbon. The first and second S/D regions and a gate stack in each of the nanoribbons provides a respective transistor of a 1T-1C memory cell, where a capacitor may be coupled to one of the S/D regions of each such transistor to complete a 1T-1C memory cell.

Using nanoribbon-based transistors to implement 3D DRAM cells with independent gate control may provide several advantages and enable unique architectures that were not possible with conventional, FEOL logic transistors. One advantage is that nanoribbon transistors may be moved to the back end of line (BEOL) layers of an advanced complementary metal oxide semiconductor (CMOS) process. Moving access transistors of memory cells to the BEOL layers means that their corresponding capacitors can be implemented in the upper metal layers with correspondingly thicker interlayer dielectric (ILD) and larger metal pitch to achieve higher capacitance, which may ease the integration challenge introduced by embedding the capacitors. Another advantage is that incorporating access transistors in different layers above the support structure may allow significantly increasing density of memory devices (e.g., density of memory cells in a memory array) having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of a structure with a given density of memory and/logic devices. Furthermore, by embedding at least some, but preferably all, of the access transistors and the corresponding capacitors in the upper metal layers (i.e., in layers away from the support structure) according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure). Still further, nanoribbon transistors may have improved performance compared to conventional FEOL transistors, or transistors of other architectures, and providing independent gate control to the access transistors of different memory cells may advantageously improve control of the overall memory devices while preserving the substrate area and cost.

As the foregoing illustrates, stacked nanoribbon-based transistors as described herein may be used to address the scaling challenges of conventional (e.g., FEOL) 1T-1C memory technology and enable high density embedded memory compatible with an advanced CMOS process. Other technical effects will be evident from various embodiments described here.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed. Furthermore, although descriptions of the present disclosure may refer to logic devices or memory cells provided in a given layer, each layer of the IC devices described herein may also include other types of devices besides logic or memory devices described herein. For example, in some embodiments, IC devices with 3D nanoribbon-based DRAM cells may also include SRAM memory cells, or any other type of memory cells, in any of the layers.

As used herein, the term "metal layer" may refer to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0,"

each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with 3D nanoribbon-based DRAM cells as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Layering

FIG. 1 provides a schematic illustration of a cross-sectional view of an example IC device 100 with multiple layers of memory and logic that may include 3D nanoribbon-based DRAM, according to some embodiments of the present disclosure. As shown in FIG. 1, in general, the IC device 100 may include a support structure 110, a FEOL device layer 120, a first memory layer 130, and a second memory layer 190.

Implementations of the present disclosure may be formed or carried out on the support structure 110, which may be, e.g., a substrate, a die, a wafer or a chip. The support structure 110 may, e.g., be the wafer 2000 of FIG. 5A, discussed below, and may be, or be included in, a die, e.g., the singulated die 2002 of FIG. 5B, discussed below. The support structure 110 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 110 may be a printed circuit board (PCB) substrate. Although a few examples of materials from which the substrate may be formed are described here, any material that may serve as a foundation upon which a semiconductor device implementing any of the 3D nanoribbon-based DRAM devices as described herein may be built falls within the spirit and scope of the present disclosure.

The first and second memory layers 130, 140 may, together, be seen as forming a memory array 190. As such, the memory array 190 may include access transistors (e.g., the transistor 100), capacitors, as well as wordlines (e.g., row selectors) and bitlines (e.g., column selectors), making up memory cells. On the other hand, the FEOL layer 120 may be a compute logic layer in that it may include various logic layers, circuits, and devices (e.g., logic transistors) to drive and control a logic IC. For example, the logic devices of the compute logic layer 120 may form a memory peripheral circuit 180 to control (e.g., access (read/write), store, refresh) the memory cells of the memory array 190.

In some embodiments, the FEOL layer 120 may be provided in a FEOL and in one or more lowest BEOL layers (i.e., in one or more BEOL layers which are closest to the support structure 110), while the first memory layer 130 and the second memory layer 140 may be seen as provided in respective BEOL layers. Various BEOL layers may be, or include, metal layers. Various metal layers of the BEOL may be used to interconnect the various inputs and outputs of the logic devices in the FEOL layer 120 and/or of the memory cells in the memory layers 130, 140. Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

In other embodiments of the IC device 100, compute logic devices may be provided in a layer above the memory layers 130, 140, in between memory layers 130, 140, or combined with the memory layers 130, 140. Nanoribbon-based transistors with independent gate control as described herein may either be used as stand-alone transistors (e.g., the transistors of the FEOL 120) or included as a part of a memory cell (e.g., the access transistors of the memory cells of the memory layers 130, 140), and may be included in various regions/locations in the IC device 100.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, although not specifically illustrated in FIG. 1. Furthermore, although two memory layers 130, 140 are shown in FIG. 1, in various embodiments, the IC device 100 may include any other number of one or more of such memory layers.

Example 1T-1C Memory Cell

Figure 2:
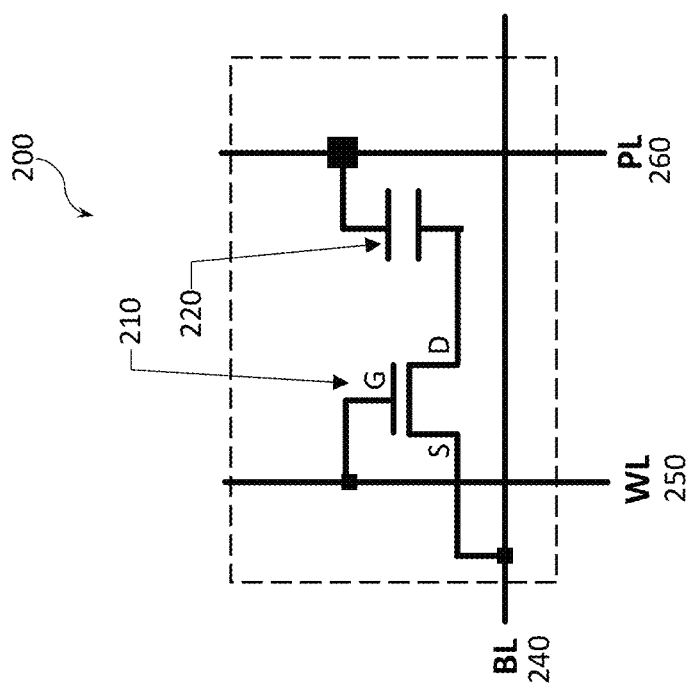
FIG. 2 is a schematic illustration of a one access transistor (1T) and one capacitor (1C) (1T-1C) memory cell, according to some embodiments of the present disclosure.

FIG. 2 is a schematic illustration of a 1T-1C memory cell 200, according to some embodiments of the present disclosure.

As shown, the 1T-1C cell 200 may include an access transistor 210 and a capacitor 220. The access transistor 210 has a gate terminal, a source terminal, and a drain terminal, indicated in the example of FIG. 2 as terminals G, S, and D, respectively. In the following, the terms "terminal" and "electrode" may be used interchangeably. Furthermore, for S/D terminals, the terms "terminal" and "region" may be used interchangeably.

As shown in FIG. 2, in the 1T-1C cell 200, the gate terminal of the access transistor 210 may be coupled to a WL 250, one of the S/D terminals of the access transistor 210 may be coupled to a BL 240, and the other one of the S/D terminals of the access transistor 210 may be coupled to a first electrode of the capacitor 220. As also shown in FIG. 2, the other electrode of the capacitor 220 may be coupled to a capacitor plateline (PL) 260. As is known in the art, WL, BL, and PL may be used together to read and program the capacitor 220.

Each of the BL 240, the WL 250, and the PL 260, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

As described above, the access transistor 210 may be a nanoribbon-based transistor (or, simply, a nanoribbon transistor, e.g., a nanowire transistor). In a nanoribbon transistor, a gate stack that may include a stack of one or more gate electrode metals and, optionally, a stack of one or more gate dielectrics may be provided around a portion of an elongated semiconductor structure called "nanoribbon", forming a gate on all sides of the nanoribbon. The portion of the nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs.

Figure 3:
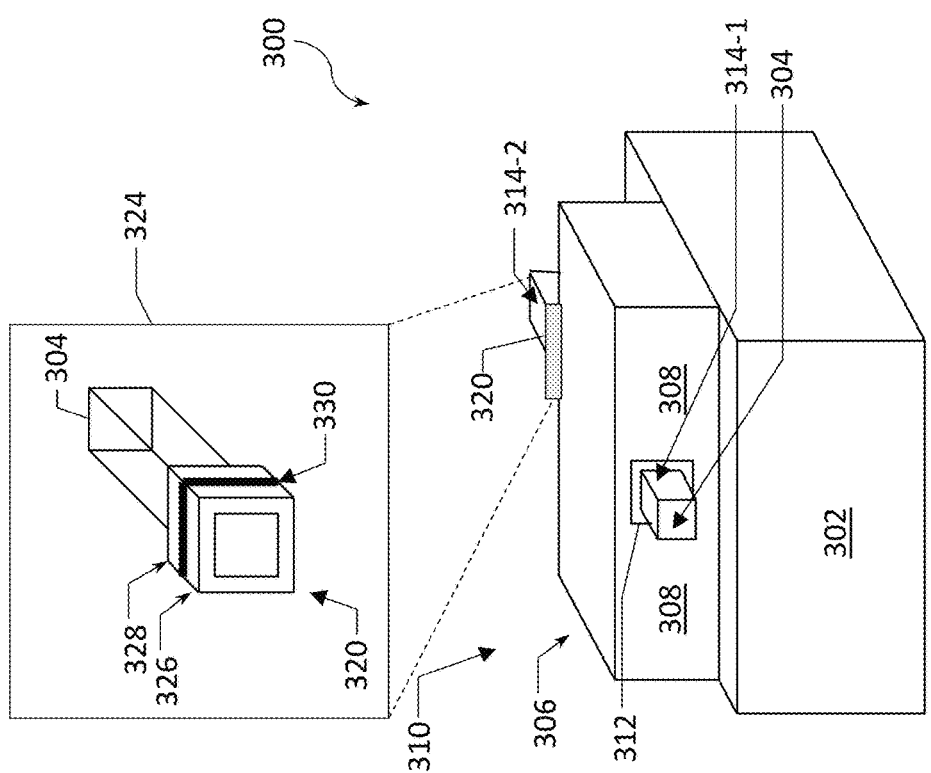
FIG. 3 is a perspective view of an example 1T-1C memory cell having a nanoribbon-based field-effect transistor (FET) access transistor, according to some embodiments of the present disclosure.

FIG. 3 is a perspective view of a 1T-1C memory cell 300, which is an example the 1T-1C memory cell 200, described above, where the access transistor 210 is implemented as a nanoribbon transistor 310 provided along a nanoribbon 304 and where the capacitor 220 is implemented as a capacitor 320, according to some embodiments of the present disclosure. Although a single memory cell 300 is illustrated in FIG. 3, this is simply for ease of illustration, and, in other embodiments, any greater number of memory cells 300 may be provided along a single nanoribbon 304 according to various embodiments of the present disclosure.

The arrangement shown in FIG. 3 (and other figures of the present disclosure) is intended to show relative arrangements of some of the components therein, and that the arrangement with the memory cell 300, or portions thereof, may include other components that are not illustrated (e.g., electrical contacts to the source and the drain of the transistor 310, additional layers such as a spacer layer, around the gate electrode of the transistor 310, etc.). For example, although not specifically illustrated in FIG. 3, a dielectric spacer may be provided between the source electrode and the gate stack as well as between the transistor drain electrode and the gate stack of the all-around-gate transistor 310 in order to provide electrical isolation between the source, gate, drain electrodes. In another example, although not specifically illustrated in FIG. 3, at least portions of the memory cell 300 may be surrounded in an insulator material, such as any suitable ILD material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the memory cell 300 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Turning to the details of FIG. 3, the transistor 310 may include a channel material formed as a nanoribbon 304 made of one or more semiconductor materials, the nanoribbon 304 provided over a base 302. In some embodiments, the base 302 may be the support structure 110, described above. In some embodiments, a layer of oxide material (not specifically shown in FIG. 3) may be provided between the base 302 and the gate electrode 310. In the embodiments of the nanoribbon-based memory cells such as the cell 300 being provided in the further BEOL layers (i.e., not right above the support structure 110), the base 302 may be a layer in which another nanoribbon transistor 310 is provided (not specifically shown in FIG. 3).

The nanoribbon 304 may take the form of a nanowire or nanoribbon, for example. Although the nanoribbon 304 illustrated in FIG. 3 is shown as having a square cross-section, the nanoribbon 304 may instead have a cross-section that is rectangular but not square, a cross-section that is rounded at corners or otherwise irregularly shaped, and the gate stack 306 may conform to the shape of the nanoribbon 304. In use, the all-around-gate transistor 310 may form conducting channels on more than three "sides" of the nanoribbon 304, potentially improving performance relative to FinFETs. Furthermore, although FIG. 3, as well as FIGS. 4-5, depict embodiments in which the longitudinal axis of the nanoribbon 304 runs substantially parallel to a plane of the base 302, this need not be the case; in other embodiments, the nanoribbon 304 may be oriented, e.g., "vertically" so as to be perpendicular to a plane of the base 302.

In some embodiments, the channel material of the nanoribbon 304 may be composed of semiconductor material systems including, for example, N-type or P-type materials systems. In some embodiments, the channel material of the nanoribbon 304 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the nanoribbon 304 may include a combination of semiconductor materials. In some embodiments, the channel material of the nanoribbon 304 may include a monocrystalline semiconductor, such as silicon (Si) or germanium (Ge). In some embodiments, the channel material of the nanoribbon 304 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 310 is an NMOS), the channel material of the nanoribbon 304 may advantageously include a III-V material having a high electron mobility, such as, but not limited to InGaAs, InP, InSb, and InAs. For some such embodiments, the channel material of the nanoribbon 304 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material of the nanoribbon 304 may be an intrinsic III-V material, i.e., a III-V semiconductor material not intentionally doped with any electrically active impurity. In alternate embodiments, a nominal impurity dopant level may be present within the channel material of the nanoribbon 304, for example to further fine-tune a threshold voltage Vt, or to provide HALO pocket implants, etc. Even for impurity-doped embodiments however, impurity dopant level within the channel material of the nanoribbon 304 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 310 is a PMOS), the channel material of the nanoribbon 304 may advantageously be a group IV material having a high hole mobility, such as, but not limited to Ge or a Ge-rich SiGe alloy. For some example embodiments, the channel material of the nanoribbon 304 may have a Ge content between 0.6 and 0.9, and advantageously may be at least 0.7. In some embodiments with highest mobility, the channel material of the nanoribbon 304 may be intrinsic III-V (or IV for P-type devices) material and not intentionally doped with any electrically active impurity. In alternate embodiments, one or more a nominal impurity dopant level may be present within the channel material of the nanoribbon 304, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

In some embodiments, the channel material of the nanoribbon 304 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 304 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 304 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

A gate stack 306 including a gate electrode material 308 and, optionally, a gate dielectric material 312, may wrap entirely or almost entirely around a portion of the nanoribbon 304 as shown in FIG. 3, with the active region of the channel material of the nanoribbon 304 corresponding to the portion of the nanoribbon 304 wrapped by the gate stack 306. In particular, the gate dielectric material 312 may wrap around a transversal portion of the nanoribbon 304 and the gate electrode material 308 may wrap around the gate dielectric material 312. In some embodiments, the gate stack 306 may fully encircle the nanoribbon 304.

The gate electrode material 308 may include at least one P-type work function metal or N-type work function metal, depending on whether the access transistor 310 is a P-type metal-oxide-semiconductor (PMOS) transistor or an N-type metal-oxide-semiconductor (NMOS) transistor (P-type work function metal used as the gate electrode material 308 when the access transistor 310 is a PMOS transistor and N-type work function metal used as the gate electrode material 308 when the access transistor 310 is an NMOS transistor). For a PMOS transistor, metals that may be used for the gate electrode material 308 may include, but are not limited to, ruthenium, palladium, platinum, cobalt, nickel, and conductive metal oxides (e.g., ruthenium oxide). For an NMOS transistor, metals that may be used for the gate electrode material 308 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 308 may include a stack of two or more metal layers, where one or more metal layers are work function metal layers and at least one metal layer is a fill metal layer. Further layers may be included next to the gate electrode material 308 for other purposes, such as to act as a diffusion barrier layer or/and an adhesion layer.

In some embodiments, the gate dielectric material 312 may include one or more high-k dielectrics including any of the materials discussed herein with reference to the insulator material that may surround portions of the memory cell 300. In some embodiments, an annealing process may be carried out on the gate dielectric material 312 during manufacture of the access transistor 310 to improve the quality of the gate dielectric material 312. The gate dielectric material 312 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 306 may be surrounded by a gate spacer, not shown in FIG. 3. Such a gate spacer would be configured to provide separation between the gate stack 306 and source/drain contacts of the transistor 310 and could be made of a low-k dielectric material, some examples of which have been provided above. A gate spacer may include pores or air gaps to further reduce its dielectric constant.

As further shown in FIG. 3, the nanoribbon 304 may include a source region and a drain region on either side of the gate stack 306, thus realizing a transistor. As is well known in the art, source and drain regions are formed for the gate stack of each MOS transistor. As described above, the source and drain regions of a transistor are interchangeable, and a nomenclature of a first S/D region and a second S/D region of an access transistor has been introduced for use in the present disclosure. In FIG. 3, reference numeral 314-1 is used to label the first S/D region and reference numeral 314-2 is used to label the second S/D region of the access transistor 310.

The S/D regions 314 of the transistor 310 may generally be formed using either an implantation/diffusion process or an etching/deposition process. In the former process, dopants such as boron, aluminum, antimony, phosphorous, or arsenic may be ion-implanted into the nanoribbon 304 to form the source and drain regions. An annealing process that activates the dopants and causes them to diffuse further into the nanoribbon 304 may follow the ion implantation process. In the latter process, portions of the nanoribbon 304 may first be etched to form recesses at the locations of the future S/D regions 314. An epitaxial deposition process may then be carried out to fill the recesses with material that is used to fabricate the S/D regions 314. In some implementations, the S/D regions 314 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 314 may be formed using one or more alternate semiconductor materials such as germanium or a group III-V material or alloy. And in further embodiments, one or more layers of metal and/or metal alloys may be used to form the S/D regions 314.

In some embodiments, the access transistor 310 may have a gate length (i.e., a distance between the first and second S/D regions 314), a dimension measured along the nanoribbon 304, between about 5 and 40 nanometers, including all values and ranges therein (e.g., between about 22 and 35 nanometers, or between about 20 and 30 nanometers). In some embodiments, an area of a transversal cross-section of the nanoribbon 304 may be between about 25 and 10000 square nanometers, including all values and ranges therein (e.g., between about 25 and 1000 square nanometers, or between about 25 and 500 nanometers).

Although not specifically shown in FIG. 3, the first S/D region 314-1 may be coupled to the BL, e.g., to the BL 240 of FIG. 2. The second S/D region 314-2 may be coupled to the capacitor 320. FIG. 3 illustrates that, in some embodiments, the capacitor 320 may be a non-planar (i.e., three-dimensional) capacitor, as shown in the particular example of FIG. 3 with the capacitor 320 being illustrated as a rectangular prism capacitor. The inset 324 of FIG. 3 illustrates individual electrodes 326, 328, and the capacitor dielectric 330 of the capacitor 320 for this embodiment of a rectangular prism capacitor 320. In the embodiments where the capacitor 320 is such a rectangular prism capacitor, each of the electrodes 326, 328, and the capacitor dielectric 330 may wrap around the nanoribbon 304, as shown in the inset 324, so that one of the capacitor electrodes, e.g., the capacitor electrode 326, is in contact with, or is otherwise coupled to, the second S/D region 314-2. As also shown in the inset 324 of FIG. 3, the two electrodes 326, 328 of the capacitor 320 may be separated by the capacitor dielectric 330 (the capacitor dielectric 330 shown in the inset 324 of FIG. 3 as a thick black line between the capacitor electrodes 326 and 328).

In some embodiments, the capacitor dielectric 330 may include any of the insulator materials described herein, e.g., any of the high-k or low-k dielectric materials described herein. In some embodiments, the capacitor dielectric 330 may be replaced with, or complemented with a layer of a ferroelectric material (i.e., in some embodiments, a ferroelectric material may be provided between the two electrodes of the capacitor 320 or 220). Such a ferroelectric material may include one or more materials which exhibit sufficient ferroelectric behavior even at thin dimensions. Some examples of such materials known at the moment include hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and yttrium-doped (Y-doped) hafnium oxide. However, in other embodiments, any other materials which exhibit ferroelectric behavior at thin dimensions may be used to replace, or to complement, the capacitor dielectric 330 and are within the scope of the present disclosure. The ferroelectric material included in the capacitor 220/320 may have a thickness that may, in some embodiments, be between about 0.5 nanometers and 10 nanometers, including all values and ranges therein (e.g., between about 1 and 8 nanometers, or between about 0.5 and 5 nanometers). Although not specifically shown in FIG. 3, in some embodiments, the access transistor 310 may also be a ferroelectric device, i.e., it may have a ferroelectric material, such as any of those described for the capacitor 320. In some embodiments, such a ferroelectric material may be included in the gate stack 306 of the access transistor 210/310, e.g., instead of, or in addition to, the gate dielectric 312.

In other embodiments (not specifically shown in the figures), the capacitor 320 may be a three-dimensional capacitor having a shape other than a rectangular prism, e.g., a cylindrical capacitor. In various embodiments, the substantially cylindrical and rectangular prism shapes of the capacitor 320 may include further modifications, e.g., the rectangular prism may have rounded corners.

Below, an example arrangement in which a plurality of nanoribbon-based 1T-1C memory cells 200/300 may be arranged to form a memory array is described.

Example 3D Nanoribbon-Based DRAM Devices

Figure 4A:
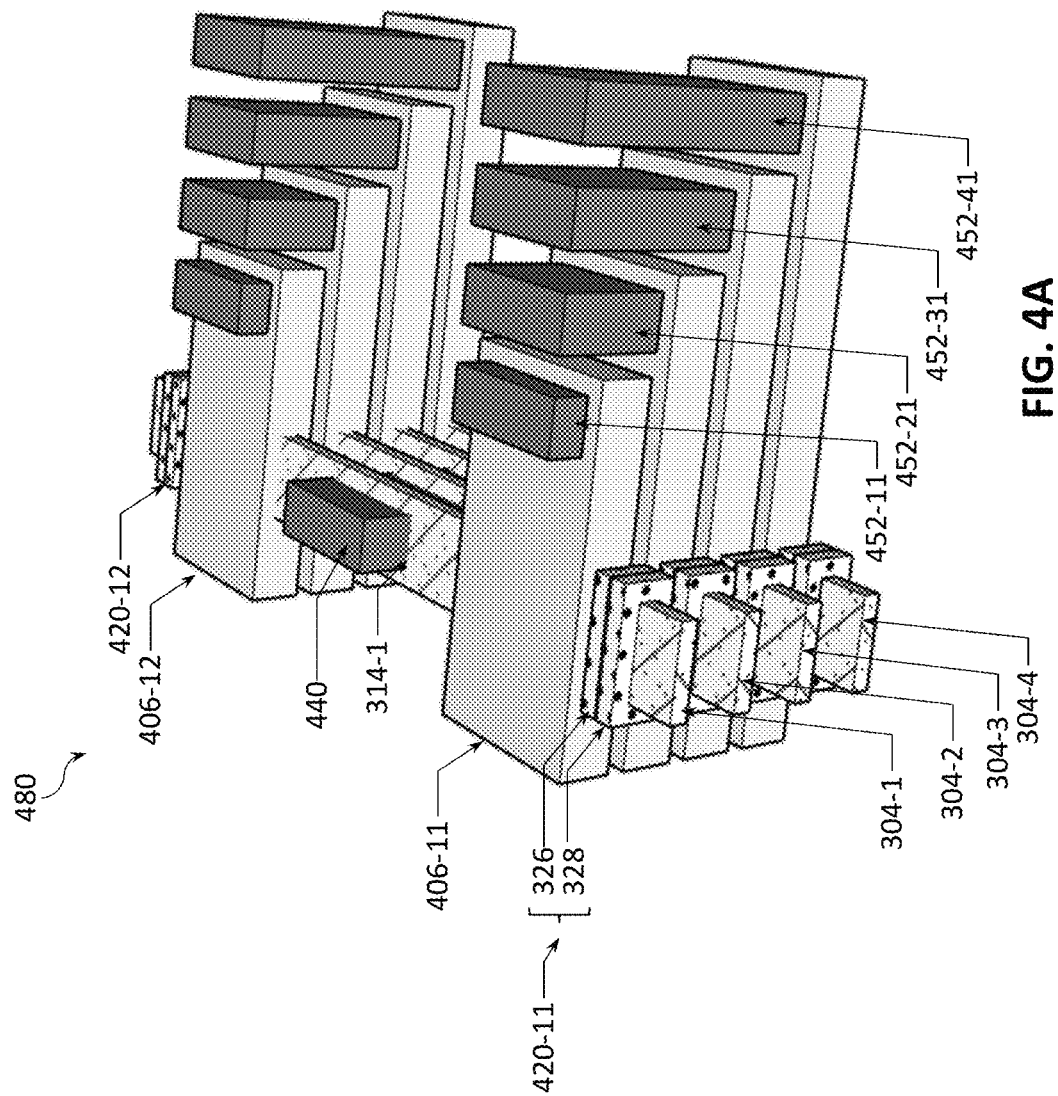
FIGS. 4A and 4B are different perspective views of an example 3D nanoribbon-based DRAM device, according to some embodiments of the present disclosure.
Figure 4B:
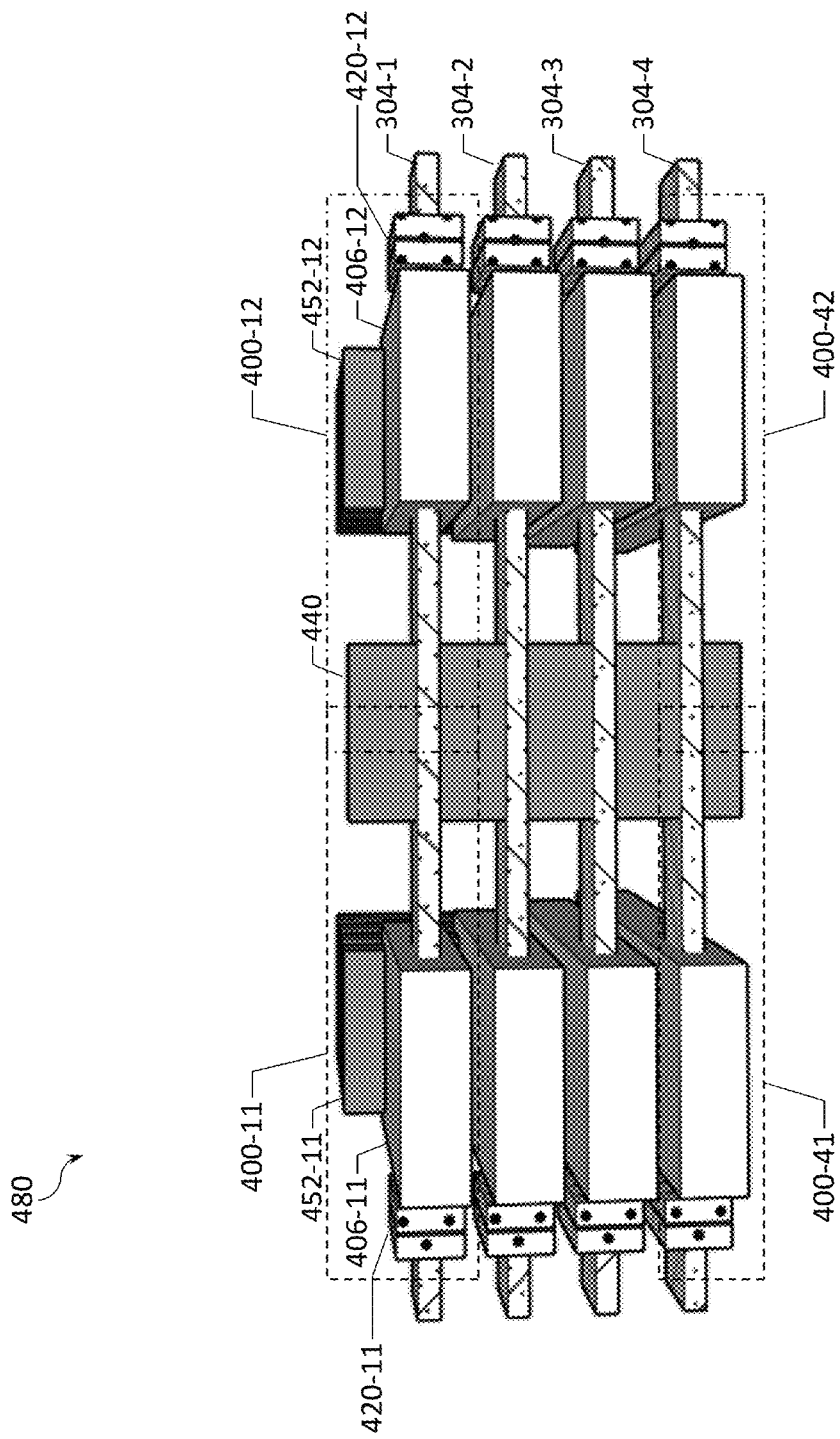

FIGS. 4A and 4B are different perspective views of an example 3D nanoribbon-based DRAM device 480, according to some embodiments of the present disclosure. Two different perspective views are shown in an attempt to bring clarity of the arrangement of the device 480, where different elements may be labeled in different views. It should be noted that not all elements shown in FIGS. 4A-4B are labeled with reference numerals in order to not clutter the drawings. For example, although 8 memory cells 400 are shown (labeled in FIG. 4B as memory cells 400-11, 400-12, ..., 400-41, and 400-42—2 memory cells 400 per each of the 4 nanoribbons 304 shown), only memory cells 400-11, 400-12, 400-41, and 400-42 are labeled.

The device 480 is an example of the IC device 100, where, e.g., each of the nanoribbons 304 of the device 480 may be considered to belong to a different one of the memory layers 130, 140, etc. The device 480 illustrates an example where two 1T-1C memory cells as described herein (e.g., as described with reference to FIG. 2 or 3) are provided along each of the nanoribbons 304, and four nanoribbons 304 are shown (labeled as 304-1, 304-2, 304-3, and 304-4). The two 1T-1C memory cells provided along each of the nanoribbons 304 are labeled as memory cells 400-11 and 400-12 for the nanoribbon 304-1, and so on, until memory cells 400-41 and 400-42 for the nanoribbon 304-4. Each of the memory cells 400 shown in FIG. 4 may be implemented as the memory cells 200/300, described above.

As shown in FIG. 4, each pair of memory cells 400 along a given nanoribbon 304 may be implemented so that one of their S/D regions/electrodes is shared (e.g., coupled to one another) and is coupled to a shared BL 440. For example, for the nanoribbon 304-1, the first memory cell 400-11 may include a gate stack 406-11 (which is an example of the gate stack 306, described above, and may be implemented as, or coupled to, the WL 250, described above), a gate contact 452-11, a first S/D region coupled to the BL 440 (which may be an example of the BL 240, described above), and a second S/D region coupled to a capacitor 420-11 (which may be an example of the capacitor 320, described above). Similarly, the second memory cell 400-12 of the nanoribbon 304-1 may include its' own gate stack 406-12 (independent of the gate stack 406-11 of the first memory cell 400-11, which may be implemented as, or coupled to, another instance of the WL 250, described above), its' own gate contact 452-12, a first S/D region coupled to the BL 440 (where the BL 440 is common/shared for the first and second memory cells 4001-11 and 400-12), and a second S/D region coupled to a capacitor 420-12 (which may be another instance of the capacitor 320, described above). Thus, in some embodiments, the first S/D regions of each pair of the transistors in a given nanoribbon (e.g., of the access transistors of the memory cells 400-11 and 400-12) may be shared with one another.

When the nanoribbons 304 extend in a direction substantially parallel to the support structure 110, the shared BLs, e.g., the BL 440, may then extend in a direction substantially perpendicular to the support structure 110. Gate contacts 452 may also extend in a direction substantially perpendicular to the support structure 110. In some embodiments, for a set of access transistors stacked above one another, the gate contacts 452 may be arranged in a staircase-like manner (e.g., as can be seen for the gate contacts 452-11, 452-21, 452-31, and 452-41, shown in FIG. 4A, i.e., where they are provided over different portions of the support structure 110) to enable easy and compact individual gate control. As can be seen in FIG. 4, in some embodiments, some of the access transistors of the memory cells in different nanoribbons may be stacked over one another (e.g., the access transistors of the memory cells 400-11, 400-21, 400-31, and 400-41 may be stacked over one another, and the access transistors of the memory cells 400-12, 400-22, 400-32, and 400-42 may be stacked over one another).

In some embodiments, each of the capacitors 420 may include a pair of capacitor electrodes 326, 328, separated by a capacitor dielectric 330, as described above, where one of the capacitor electrodes (e.g., the capacitor electrode 326) is coupled to the first S/D region of a corresponding access transistor of a given memory cell. As described above, the other one of the capacitor electrodes (e.g., the capacitor electrode 328) may be coupled to a PL, e.g., the PL 260 (although this is not specifically shown in FIG. 4). Although not specifically shown in FIG. 4, in some embodiments, the capacitor dielectric 330 and/or the gate dielectric of any of the gate stacks of the access transistors of the memory cells 400 may include a ferroelectric material, e.g., as described above.

The device 480 illustrates how DRAM may be created in a NAND-like fashion where access transistors of multiple memory cells can be created in parallel. The topology illustrated in FIG. 4 creates a vertical stack of access transistor where one of their S/D regions (e.g., source regions) may be isolated from one another for coupling to individual/respective capacitors 420. In the device 480, some of the bitlines (e.g., the BL 440) can be shorted (i.e., electrically coupled to one another, or be a shared BL) and the wordlines can be created in a staircase fashion. Such a vertical topology can advantageously create a relatively small bitline capacitance and, therefore, the storage nodes of the individual memory cells can be very small, which may advantageously enable integration of small capacitors. With such an approach, a large number of vertical memory cells may be fabricated at very low cost.

Variations and Implementations

Various device assemblies illustrated in FIGS. 1-4 do not represent an exhaustive set of IC devices with 3D nanoribbon-based DRAM as described herein, but merely provide examples of such devices/structures/assemblies. In particular, the number and positions of various elements shown in FIGS. 1-4 is purely illustrative and, in various other embodiments, other numbers of these elements, provided in other locations relative to one another may be used in accordance with the general architecture considerations described herein. For example, in some embodiments, logic devices, e.g., implemented as/using the transistors 310 or implemented as/using transistors of any other architecture, may included in any of the IC devices shown in FIGS. 1-4, either in the same or separate metal layers from those in which the memory cells are shown.

Further, FIGS. 1-4 are intended to show relative arrangements of the elements therein, and the device assemblies of these figures may include other elements that are not specifically illustrated (e.g., various interfacial layers). Similarly, although particular arrangements of materials are discussed with reference to FIGS. 1-4, intermediate materials may be included in the IC devices and assemblies of these figures. Still further, although some elements of the various cross-sectional views are illustrated in FIGS. 1-4 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of the 3D nanoribbon-based DRAM devices as described herein.

Example Electronic Devices

Arrangements with one or more 3D nanoribbon-based DRAM devices as disclosed herein may be included in any suitable electronic device. FIGS. 5-8 illustrate various examples of devices and components that may include one or more three-dimensional memory arrays with multiplexing across different layers as disclosed herein.

FIGS. 5A-5B are top views of a wafer 2000 and dies 2002 that may include one or more 3D nanoribbon-based DRAM devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory arrays with 3D nanoribbon-based DRAM devices as described herein). After the fabrication of the semiconductor product is complete (e.g., after manufacture of one or more layers of the nanoribbon-based DRAM cells as described herein (e.g. any embodiment of the memory array 190 of the IC device 100, e.g. including an array of any of the memory cells described herein), the wafer 2000 may undergo a singulation process in which each of the dies 2002 is separated from one another to provide discrete "chips" of the semiconductor product. In particular, devices that include one or more 3D nanoribbon-based DRAM devices as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a DRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 8) or other logic that is configured to store information in the memory devices or execute instructions stored in the memory array.

Figure 6:
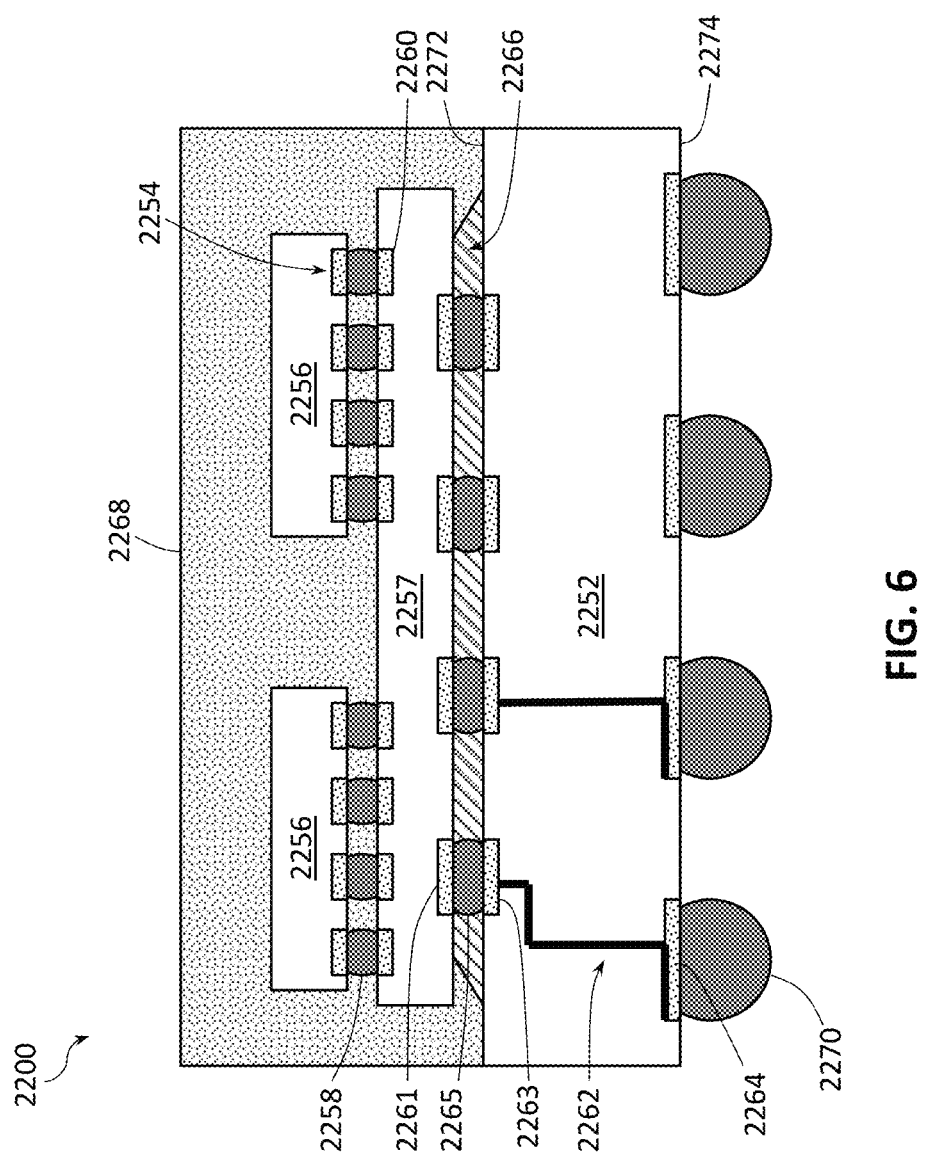
FIG. 6 is a cross-sectional side view of an IC package that may include one or more 3D nanoribbon-based DRAM devices in accordance with any of the embodiments disclosed herein.

FIG. 6 is a side, cross-sectional view of an example IC package 2200 that may include one or more 3D nanoribbon-based DRAM devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein (e.g., may include any of the embodiments of the 3D nanoribbon-based DRAM devices as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more 3D nanoribbon-based DRAM devices, e.g., as discussed above; in some embodiments, at least some of the dies 2256 may not include any 3D nanoribbon-based DRAM devices.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
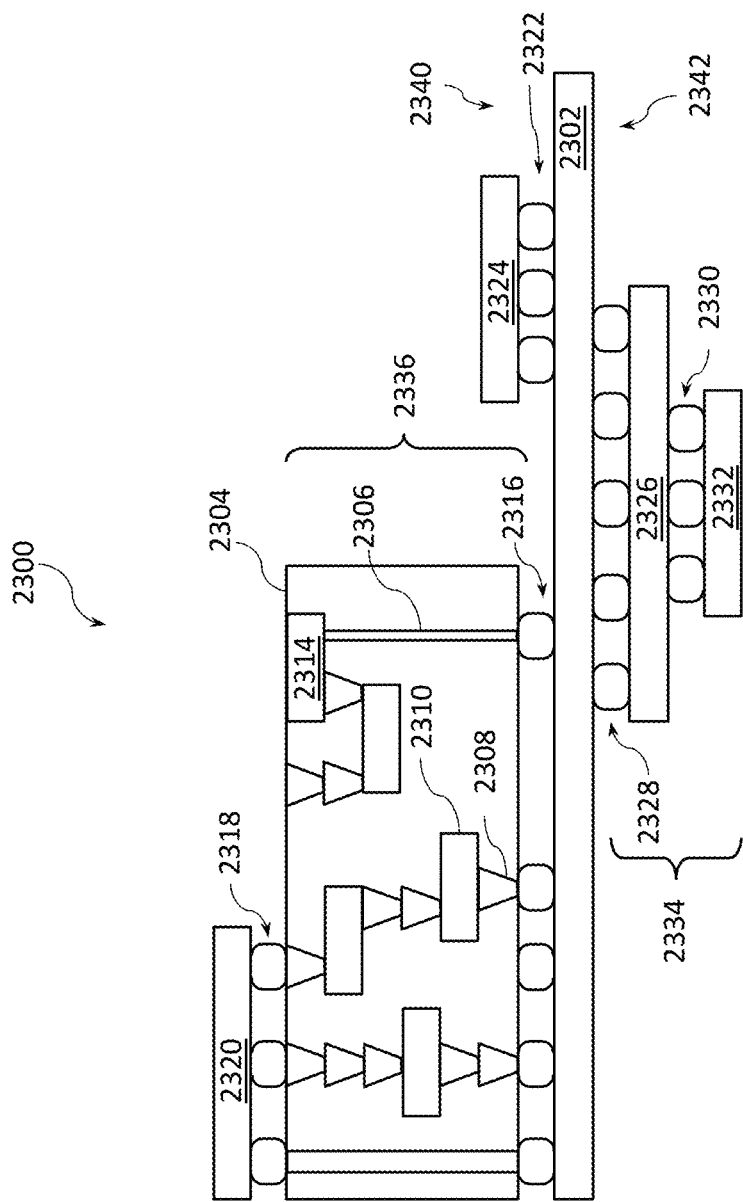
FIG. 7 is a cross-sectional side view of an IC device assembly that may include one or more 3D nanoribbon-based DRAM devices in accordance with any of the embodiments disclosed herein.

FIG. 7 is a cross-sectional side view of an IC device assembly 2300 that may include components having one or more 3D nanoribbon-based DRAM devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 3D memory arrays with nanoribbon-based DRAM cells in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more 3D nanoribbon-based DRAM devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device, or any other suitable component. In particular, the IC package 2320 may include one or more 3D nanoribbon-based DRAM devices as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
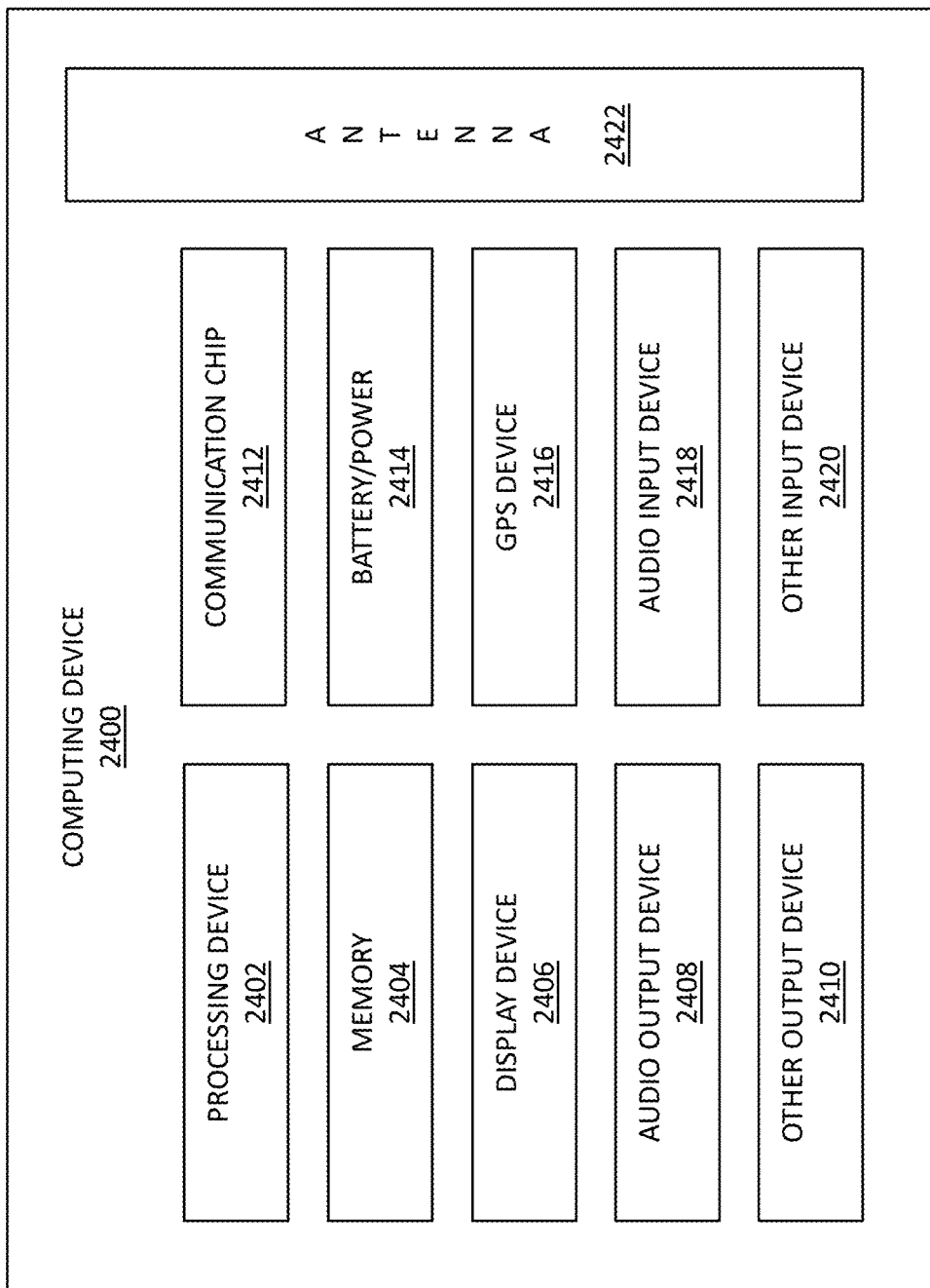
FIG. 8 is a block diagram of an example computing device that may include one or more 3D nanoribbon-based DRAM devices in accordance with any of the embodiments disclosed herein.

FIG. 8 is a block diagram of an example computing device 2400 that may include one or more components with one or more 3D nanoribbon-based DRAM devices in accordance with any of the embodiments disclosed herein. For example, any suitable ones of the components of the computing device 2400 may include a die (e.g., the die 2002 (FIG. 5B)) including one or more 3D arrays of nanoribbon-based DRAM cells in accordance with any of the embodiments disclosed herein. Any of the components of the computing device 2400 may include an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include eDRAM, e.g. a 3D array of nanoribbon-based DRAM cells as described herein, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides memory device (or, more generally, an IC device) that includes a support structure (e.g., a substrate, a chip, or a wafer); a first semiconductor nanoribbon, extending in a direction substantially parallel to the support structure (where, in general, the term "nanoribbon" refers to an elongated semiconductor structure such as a nanoribbon or a nanowire, having a long axis parallel to the support structure); a second semiconductor nanoribbon, extending in a direction substantially parallel to the support structure and stacked above the first nanoribbon so that the first nanoribbon is between the support structure and the second nanoribbon; a first transistor and a second transistor provided, each including a first source or drain (S/D) region and a second S/D region in the first nanoribbon; and a third transistor and a fourth transistor provided, each including a first S/D region and a second S/D region in the second nanoribbon. The first S/D region of the first transistor is coupled to the first S/D region of the second transistor. The first S/D region of the third transistor is coupled to the first S/D region of the fourth transistor. The second S/D region of each of the first, second, third, and fourth transistors is coupled to a respective capacitor (in other words, the second S/D region of each of the first, second, third, and fourth transistors is coupled to a different one of a first, second, third, and fourth capacitors).

Example 2 provides the memory device according to example 1, where the first S/D region of each of the first, second, third, and fourth transistors is coupled to a single (i.e., shared) bitline.

Example 3 provides the memory device according to example 2, where each of the first and second nanoribbons extends in a direction substantially parallel to a support structure over which the memory device is provided, and the bitline extends in a direction substantially perpendicular to the support structure.

Example 4 provides the memory device according to any one of the preceding examples, where a gate stack of each of the first, second, third, and fourth transistors is coupled to a respective gate contact (i.e., the gates of the transistors are individually controlled).

Example 5 provides the memory device according to example 4, where each of the respective gate contacts is provided over a different portion of a support structure over which the memory device is provided.

Example 6 provides the memory device according to any one of the preceding examples, where each of the respective capacitors coupled to the second S/D regions of the first and second transistors includes a first capacitor electrode, a second capacitor electrode, and a capacitor insulator, each of which substantially wraps around the first nanoribbon. Similarly, each of the respective capacitors coupled to the second S/D regions of the third and fourth transistors includes a first capacitor electrode, a second capacitor electrode, and a capacitor insulator, each of which substantially wraps around the second nanoribbon.

Example 7 provides a memory device (or, more generally, an IC device) that includes a first nanoribbon of a first semiconductor material; a second nanoribbon of a second semiconductor material; a first source or drain (S/D) region and a second S/D region in each of the first nanoribbon and the second nanoribbon; a first gate stack at least partially surrounding a portion of the first nanoribbon between the first S/D region and the second S/D region in the first nanoribbon; a second gate stack, not electrically coupled to the first gate stack, at least partially surrounding a portion of the second nanoribbon between the first S/D region and the second S/D region in the second nanoribbon; and a bitline coupled to each of the first S/D region of the first nanoribbon and the first S/D region of the second nanoribbon.

Example 8 provides the memory device according to example 7, where the memory device further includes a support structure (e.g., a substrate), and at least a portion of the first nanoribbon is between the support structure and at least a portion of the second nanoribbon.

Example 9 provides the memory device according to example 8, where the memory device further includes a first gate contact electrically coupled to the first gate stack and a second gate contact electrically coupled to the second gate stack, the first gate contact is a first region of the support structure and the second gate contact is over a second region of the support structure, the second region being different and non-overlapping with the first region.

Example 10 provides the memory device according to any one of examples 7-9, further including a first storage node coupled to the second S/D region of the first nanoribbon, and a second storage node coupled to the second S/D region of the second nanoribbon.

In a further example according to example 10, each of the first storage node and the second storage node may include a capacitor.

Example 11 provides the memory device according to any one of examples 7-10, where the first gate stack includes a gate electrode material and a ferroelectric material, and the ferroelectric material is between the gate electrode material and the first semiconductor material.

In other embodiments, the second gate stack may be similar to the first gate stack and also include a ferroelectric material, which may be have either the same or different material composition than the ferroelectric material of the first gate stack.

Example 12 provides the memory device according to any one of examples 7-11, where the memory device further includes a third S/D region in the first nanoribbon, and a third gate stack at least at least partially surrounding a portion of the first nanoribbon between the first S/D region and the third S/D region in the first nanoribbon.

Example 13 provides the memory device according to example 12, where the memory device includes a first memory cell, a second memory cell, and a third memory cell, the first memory cell includes a transistor (an access transistor) including the first S/D region in the first nanoribbon, the second S/D region in the first nanoribbon, and the first gate stack, the second memory cell includes a transistor (an access transistor) including the first S/D region in the second nanoribbon, the second S/D region in the second nanoribbon, and the second gate stack, and the third memory cell includes a transistor (an access transistor) including the first S/D region in the first nanoribbon, the third S/D region in the first nanoribbon, and the third gate stack.

Example 14 provides the memory device according to any one of examples 7-13, further including a third storage node coupled to the third S/D region of the first nanoribbon.

Example 15 provides the memory device according to example 14, where the third storage node includes a capacitor.

Example 16 provides a memory device (or, more generally, an IC device) that includes a storage node and a transistor (an access transistor) that includes a nanoribbon of a semiconductor material, a first source or drain (S/D) region, coupled to a bitline (BL), a second (S/D) region, coupled to the storage node, and a gate stack that at least partially surrounds a portion of the nanoribbon between the first S/D region and the second S/D region.

Example 17 provides the memory device according to example 16, where the gate stack includes a gate electrode material and a ferroelectric material, and the ferroelectric material is between the gate electrode material and the semiconductor material of the nanoribbon.

Example 18 provides the memory device according to examples 16 or 17, where the storage node includes a capacitor including a first capacitor electrode, a second capacitor electrode, and a thin-film dielectric material between the first and second capacitor electrodes.

Example 19 provides the memory device according to examples 16 or 17, where the storage node includes a capacitor including a first capacitor electrode, a second capacitor electrode, and a thin-film ferroelectric material between the first and second capacitor electrodes.

Example 20 provides the memory device according to example 19, where the ferroelectric material includes one or more of a ferroelectric material including hafnium, zirconium, and oxygen; a ferroelectric material including hafnium, silicon, and oxygen; a ferroelectric material including hafnium, germanium, and oxygen; a ferroelectric material including hafnium, aluminum, and oxygen; or a ferroelectric material including hafnium, yttrium, and oxygen.

In some embodiments of example 20, the ferroelectric material may have a thickness between about 1 nanometer and 10 nanometers (i.e., the ferroelectric material is a thin-film ferroelectric material).

Example 21 provides an IC package that includes an IC die, including one or more of the memory/IC devices according to any one of the preceding examples. The IC package may also include a further component, coupled to the IC die.

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of the memory/IC devices according to any one of the preceding examples (e.g., memory/IC devices according to any one of examples 1-20), and/or the IC die is included in the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A memory device, comprising:
a first nanoribbon;
a second nanoribbon, stacked above the first nanoribbon;
a first transistor and a second transistor, each comprising a first source or drain (S/D) region and a second S/D region in the first nanoribbon; and
a third transistor and a fourth transistor, each comprising a first S/D region and a second S/D region in the second nanoribbon,
wherein:
the first S/D region of the first transistor is coupled to the first S/D region of the second transistor,
the first S/D region of the third transistor is coupled to the first S/D region of the fourth transistor,
the second S/D region of each of the first, second, third, and fourth transistors is coupled to a respective capacitor,
a channel portion of the first transistor is coupled to a first wordline,
a channel portion of the third transistor is coupled to a second wordline,
the second wordline is stacked above the first wordline, and
contacts to the second wordline and the first wordline are in a staircase arrangement.

2. The memory device according to claim 1, wherein the first S/D region of each of the first, second, third, and fourth transistors is coupled to a bitline.

3. The memory device according to claim 2, wherein:
each of the first and second nanoribbons extends in a direction substantially parallel to a substrate over which the memory device is provided, and
the bitline extends in a direction substantially perpendicular to the substrate.

4. The memory device according to claim 1, wherein a gate stack of each of the first, second, third, and fourth transistors is coupled to a respective gate contact.

5. The memory device according to claim 4, wherein each of the respective gate contacts is over a different portion of a substrate over which the memory device is provided.

6. The memory device according to claim 1, wherein the respective capacitor for the first transistor includes a first capacitor electrode, a second capacitor electrode, and a capacitor insulator, and the first capacitor electrode and the second capacitor electrode wrap around the first nanoribbon.

7. The memory device according to claim 1, wherein a gate stack of at least one of the first, second, third, and fourth transistors includes a gate electrode material and a ferroelectric material.

8. The memory device according to claim 1, wherein the memory device is a dynamic random-access memory (DRAM) device.

9. The memory device according to claim 1, wherein:
the memory device includes an integrated circuit (IC) die and a further component, coupled to the IC die, and
the IC die includes the first nanoribbon, the second nanoribbon, and the first, second, third, and fourth transistors.

10. The memory device according to claim 9, wherein the further component is one of a package substrate, a flexible substrate, or an interposer.

11. A memory device, comprising:
a substrate;
a nanoribbon over the substrate;
a gate stack, at least partially surrounding a portion of the nanoribbon; and
a capacitor that includes a first capacitor electrode, a second capacitor electrode, and a capacitor insulator between the first and second capacitor electrodes,
wherein:

each of the first capacitor electrode and the second capacitor electrode has a ring shape that surrounds a further portion of the nanoribbon,
all portions of the first capacitor electrode are closer to the gate stack than any portion of the second capacitor electrode, and
all portions of the capacitor insulator are closer to the gate stack than any portion of the second capacitor electrode.

12. The memory device according to claim 11, wherein the further portion of the nanoribbon is adjacent to the portion of the nanoribbon at least partially surrounded by the gate stack.

13. The memory device according to claim 11, wherein the capacitor insulator includes a dielectric material.

14. The memory device according to claim 11, wherein the capacitor insulator includes a ferroelectric material.

15. The memory device according to claim 11, wherein the capacitor insulator includes a dielectric material and a ferroelectric material.

16. The memory device according to claim 1, wherein the second S/D region of the each of the first, second, third, and fourth transistors being coupled to a respective capacitor includes the second S/D region of the first transistor being coupled to a first capacitor, the second transistor being coupled to a second capacitor, the third transistor being coupled to a third capacitor, and the fourth transistor being coupled to a fourth capacitor.

17. An integrated circuit (IC) device, comprising:
a substrate;
a first nanoribbon over the substrate;
a second nanoribbon over the substrate, wherein the second nanoribbon is stacked above the first nanoribbon;
a first transistor and a second transistor, each comprising a first source or drain (S/D) region and a second S/D region in the first nanoribbon;
a third transistor and a fourth transistor, each comprising a first S/D region and a second S/D region in the second nanoribbon;
a first wordline substantially parallel to the substrate; and
a second wordline substantially parallel to the substrate, wherein:
the first S/D region of the first transistor is coupled to the first S/D region of the second transistor,
the first S/D region of the third transistor is coupled to the first S/D region of the fourth transistor, and
the first S/D region of the first transistor is between the second S/D region of the first transistor and the second S/D region of the second transistor,
the first wordline at least partially wraps around a channel portion of the first transistor,
the second wordline at least partially wraps around a channel portion of the third transistor,
the second wordline is stacked above the first wordline, and
a gate contact to the first wordline and a gate contacts to the second wordline are over different portions of the substrate.

18. The IC device according to claim 17, wherein:
the first S/D region of each of the first, second, third, and fourth transistors is coupled to a bitline,
each of the first and second nanoribbons extends in a direction substantially parallel to the substrate, and
the bitline extends in a direction substantially perpendicular to the substrate.

19. The IC device according to claim 17, wherein the first S/D region of the first transistor is between a gate stack of the first transistor and a gate stack of the second transistor.

20. The IC device according to claim 17, wherein a gate electrode of the first transistor wraps around a first portion of the first nanoribbon and a gate electrode of the second transistor wraps around a first portion of the first nanoribbon.

* * * * *